(12) United States Patent
Yasuda et al.

(10) Patent No.: US 11,244,889 B2
(45) Date of Patent: Feb. 8, 2022

(54) SEMICONDUCTOR DEVICE

(71) Applicant: FUJI ELECTRIC CO., LTD., Kawasaki (JP)

(72) Inventors: Yoshihiro Yasuda, Matsumoto (JP); Kenpei Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 61 days.

(21) Appl. No.: 16/799,077

(22) Filed: Feb. 24, 2020

(65) Prior Publication Data

US 2020/0312754 A1 Oct. 1, 2020

(30) Foreign Application Priority Data

Apr. 1, 2019 (JP) .............................. JP2019-069587

(51) Int. Cl.
*H01L 23/498* (2006.01)
*H01L 23/00* (2006.01)
*H01L 23/31* (2006.01)
*H01L 23/495* (2006.01)

(52) U.S. Cl.
CPC .... *H01L 23/49811* (2013.01); *H01L 23/3114* (2013.01); *H01L 23/49575* (2013.01); *H01L 24/45* (2013.01)

(58) Field of Classification Search
CPC ........... H01L 23/49811; H01L 23/3114; H01L 23/49575; H01L 24/45
See application file for complete search history.

(56) References Cited

U.S. PATENT DOCUMENTS

| 5,420,758 A | * | 5/1995 | Liang ................ H01L 23/49811 361/813 |
| 9,627,299 B1 | * | 4/2017 | Flessner ............ H01L 23/49582 |
| 2003/0164535 A1 | | 9/2003 | Inatsugu |
| 2005/0260787 A1 | * | 11/2005 | Punzalan .......... H01L 23/49548 438/106 |
| 2006/0049523 A1 | * | 3/2006 | Lin .................. H01L 23/49811 257/738 |
| 2008/0157311 A1 | * | 7/2008 | Smith ............... H01L 23/49575 257/678 |

(Continued)

FOREIGN PATENT DOCUMENTS

| JP | 2000-307045 A | 11/2000 |
| JP | 2001-015668 A | 1/2001 |

(Continued)

*Primary Examiner* — Nathan W Ha
(74) *Attorney, Agent, or Firm* — Rabin & Berdo, P.C.

(57) ABSTRACT

A semiconductor device includes a semiconductor element, a bonding wire that is electrically connected to the semiconductor element, a connection terminal, and sealing material that seals the semiconductor element, the bonding wire, and a part of the connection terminal. In addition, the connection terminal includes a plate-shaped lead part having a bonding area to which the bonding wire is bonded and an anchor part protruding from a first side part of the lead part. In the semiconductor device, since the rear surface of a die pad and the rear surface of the lead part exposed to the outside in a sealing main surface of the sealing material occupy a predetermined area or more, the heat dissipation of the semiconductor device is improved.

14 Claims, 10 Drawing Sheets

(56) References Cited

U.S. PATENT DOCUMENTS

| | | | |
|---|---|---|---|
| 2009/0079043 A1* | 3/2009 | Hasegawa | H01L 23/3142 257/666 |
| 2009/0079051 A1* | 3/2009 | Amano | H01L 24/32 257/676 |
| 2009/0200649 A1* | 8/2009 | Tanaka | H01L 23/49551 257/676 |
| 2010/0133670 A1* | 6/2010 | Liu | H01L 23/49524 257/675 |
| 2011/0089547 A1* | 4/2011 | Holloway | H01L 21/568 257/676 |
| 2016/0013120 A1* | 1/2016 | Hayashi | H01L 21/4842 257/676 |
| 2016/0351488 A1* | 12/2016 | Kamiyama | H01L 23/49811 |
| 2017/0033055 A1* | 2/2017 | Watanabe | H01L 23/49548 |
| 2017/0084547 A1* | 3/2017 | Ito | H01L 21/4842 |
| 2017/0229389 A1* | 8/2017 | Katsuki | H01L 23/057 |
| 2017/0301612 A1 | 10/2017 | Haga et al. | |
| 2018/0076909 A1* | 3/2018 | Latham | H01L 25/0655 |
| 2018/0166369 A1* | 6/2018 | Cook | H01L 24/32 |
| 2019/0221549 A1* | 7/2019 | Hayashi | H01L 25/18 |
| 2020/0312753 A1* | 10/2020 | Hishiki | H01L 24/48 |

FOREIGN PATENT DOCUMENTS

| | | |
|---|---|---|
| JP | 2002-237550 A | 8/2002 |
| JP | 2003-258183 A | 9/2003 |
| JP | 2017-191895 A | 10/2017 |

\* cited by examiner

SEMICONDUCTOR DEVICE

CROSS-REFERENCE TO RELATED APPLICATION

This application is based upon and claims the benefit of priority of the prior Japanese Patent Application No. 2019-069587, filed on Apr. 1, 2019, the entire contents of which are incorporated herein by reference.

BACKGROUND OF THE INVENTION

1. Field of the Invention

The embodiment discussed herein is related to a semiconductor device.

2. Background of the Related Art

For example, semiconductor devices include semiconductor elements such as insulated gate bipolar transistors (IGBTs), power metal oxide semiconductor field effect transistors (MOSFETs), freewheeling diodes (FWDs), or Schottky barrier diodes (SBDs). As needed, power conversion devices are realized by arranging IGBTs and FWDs on substrates (see, for example, Japanese Laid-open Patent Publication No. 2017-191895).

These semiconductor devices use large currents and voltages and generate heat. Such heating of a semiconductor device could cause a breakdown of the semiconductor device. Namely, the reliability of the semiconductor device could be deteriorated. Thus, the heat dissipation of the semiconductor devices needs to be improved further.

SUMMARY OF THE INVENTION

In one aspect of the embodiment, there is provided a semiconductor device including: a semiconductor element; a connection member that is electrically connected to the semiconductor element; a connection terminal that includes a plate-shaped lead part having a first front surface including a bonding area to which the connection member is bonded, a rear surface opposite to the first front surface, and first side surfaces opposite to each other and located between the first front surface and the rear surface, and an anchor part protruding from one of the first side surfaces at a position corresponding to the bonding area, the anchor part having a second front surface on a plane of the first front surface, and a second side surface between the second front surface and the rear surface at a side where one of the first side surfaces of the lead part is located; and a sealing material that seals the semiconductor element, the connection member, and a part of the connection terminal and that has a sealing main surface on a plane of the rear surface of the connection terminal, and a first sealing side surface perpendicular to the sealing main surface and the first side surfaces of the lead part. The lead part includes an inner lead part sealed by the sealing material, and an outer lead part exposed outside the sealing material from the first sealing side surface. The anchor part protrudes by a predetermined protrusion length from one of the first side surfaces, and in a sectional view perpendicular to a long-side direction of the lead part, at the one of the first side surfaces, the closer is a position of the anchor part to the rear surface of the connection terminal is, the shorter is the protrusion length of the anchor part.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
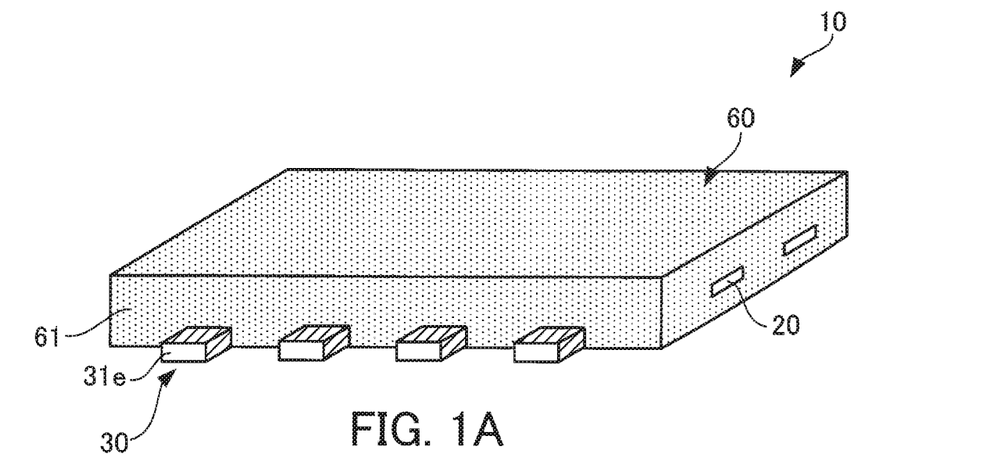
FIGS. 1A and 1B illustrate a semiconductor device according to an embodiment.
Figure 1B:
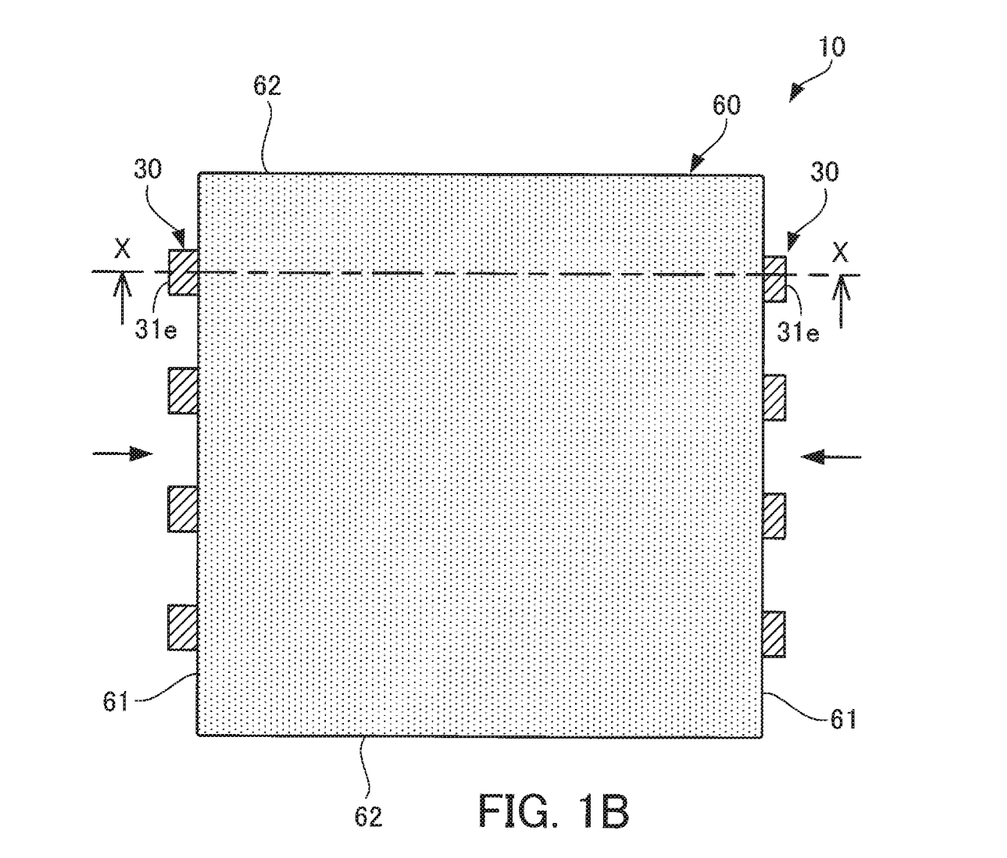
Figure 2A:
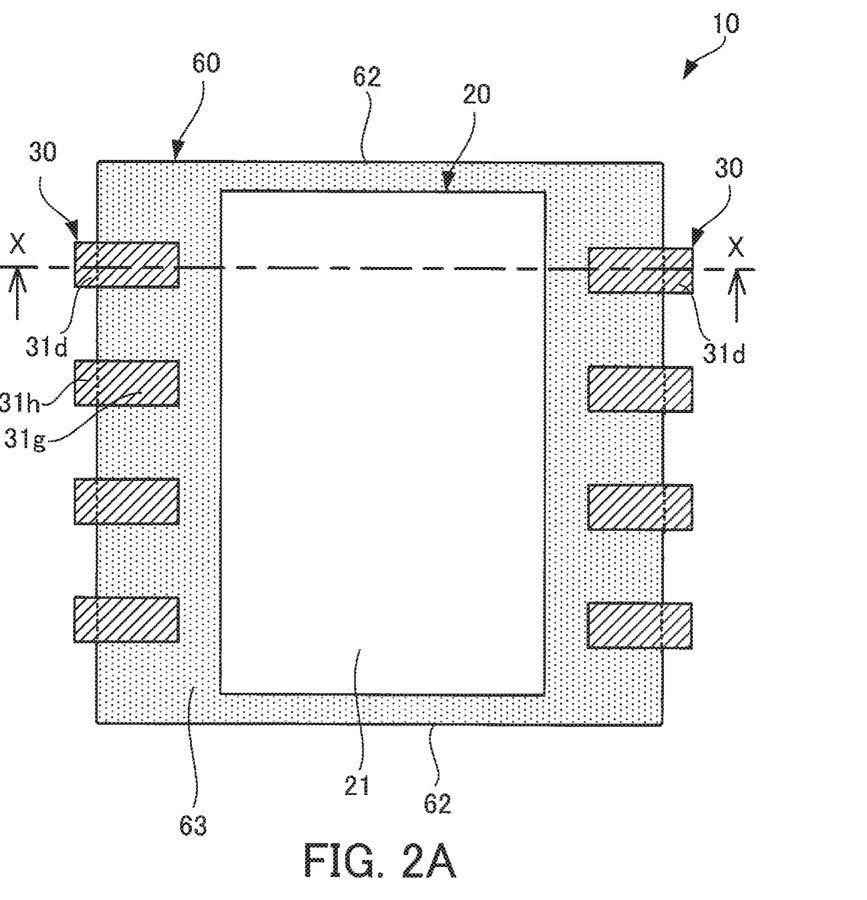
FIGS. 2A and 2B illustrate the semiconductor device according to the embodiment.
Figure 2B:
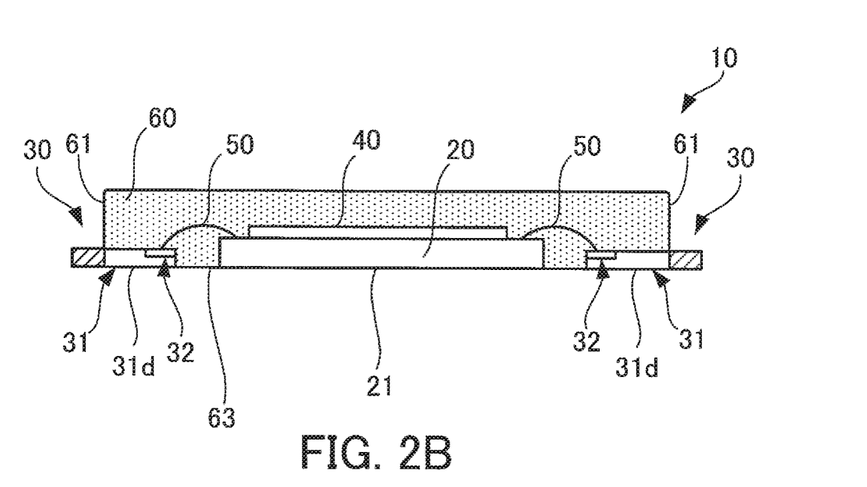
Figure 3:
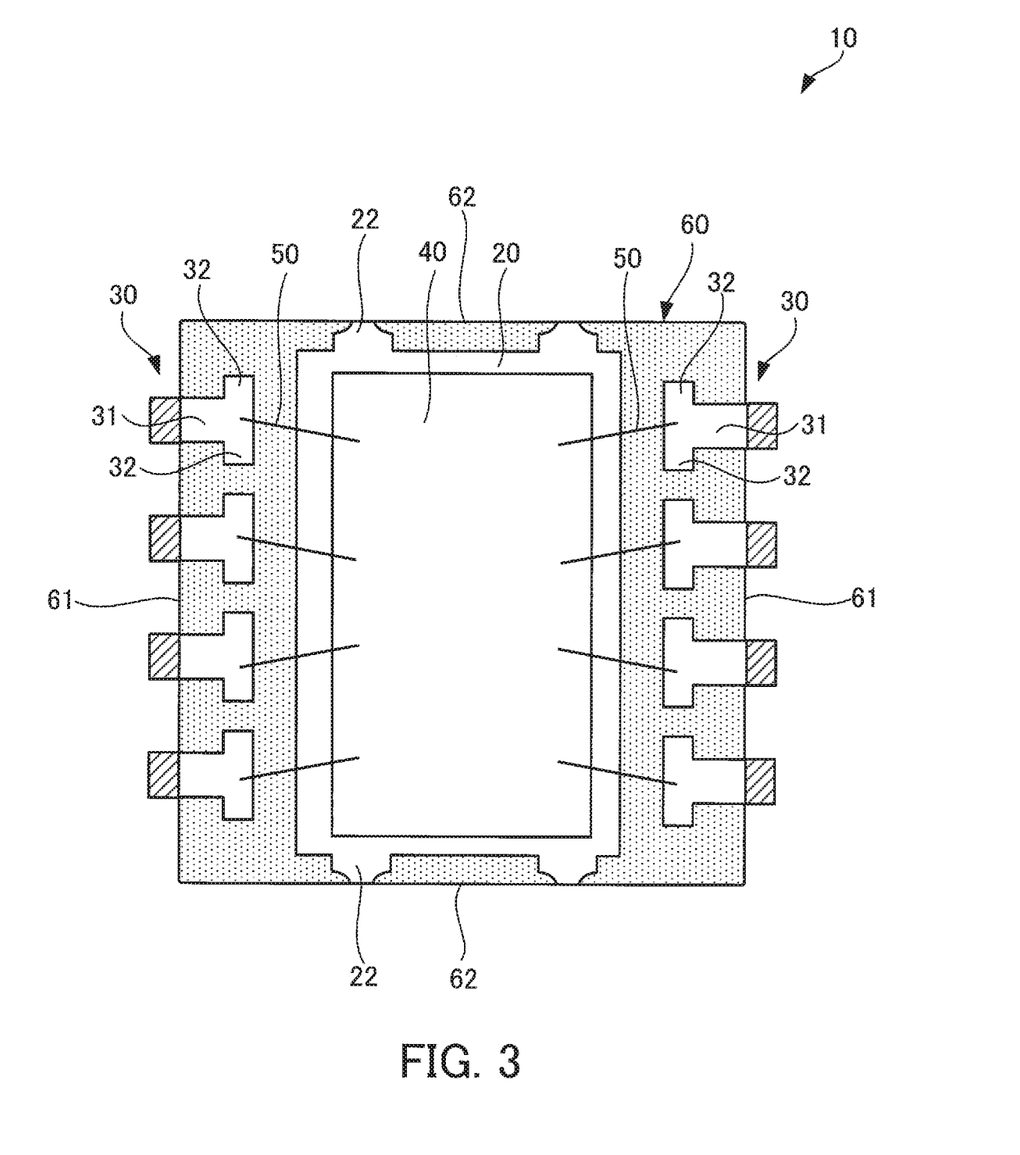
FIG. 3 illustrates the semiconductor device according to the embodiment.

Hereinafter, a semiconductor device according to an embodiment will be described with reference to the accompanying drawings. FIGS. 1A to 3 illustrate a semiconductor device 10 according to the embodiment. More specifically, FIG. 1A is a perspective view of the semiconductor device 10 seen from the direction of an arrow in FIG. 1B, and FIG. 1B is a plan view of the semiconductor device 10. FIG. 2A illustrates a rear surface of the semiconductor device 10, and FIG. 2B is a sectional view of the semiconductor device 10, taken along an alternate long and short dash line X-X in FIG. 1B and FIG. 2A. FIG. 3 transparently illustrates a plan view of the semiconductor device 10.

In the embodiment, the front surface of the semiconductor device 10 in FIGS. 1A and 1B faces upward. For example, a die pad 20 in FIG. 2B has a front surface on which a semiconductor element 40 is mounted. The rear surface of the semiconductor device 10 in FIGS. 1A and 1B faces downward. For example, the die pad 20 in FIG. 2B has a rear surface opposite to the front surface on which the semiconductor element 40 is mounted. Other front surfaces and rear surfaces than those in FIGS. 1A and 1B also signify the same orientations.

The semiconductor device 10 includes the die pad 20, a plurality of connection terminals 30, the semiconductor element 40 mounted on the die pad 20, and bonding wires 50 each of which electrically connects the semiconductor element 40 and the individual connection terminal 30. These members are sealed by sealing material 60 to form an approximately rectangular shape. In this way, the semiconductor device 10 is manufactured.

The die pad 20 is made of metal material such as aluminum, iron, silver, copper, or an alloy containing at least one kind of these elements having excellent thermal conductivity. In addition, suspension pin parts 22 are formed on opposite short sides of the die pad 20. The suspension pin parts 22 support the die pad 20 from a frame part (described below) before the frame part is cut off. Two suspension pin parts 22 may be formed on each of the opposite short sides of the die pad 20. The rear surface 21 of the die pad 20 is exposed to the outside in a sealing main surface 63, which is the rear surface of the sealing material 60. The rear surface 21 and the sealing main surface 63 are on the same plane. In addition, end surfaces of the suspension pin parts 22 of the die pad 20 are exposed to the outside in the two opposite sealing side surfaces 62 of the sealing material 60.

The individual connection terminal 30 has a plate-shaped lead part 31 to which a bonding wire 50 is bonded and an anchor part 32 formed on each side part of the lead part 31. A configuration of the connection terminal 30 will be described in detail below. Four connection terminals 30 are arranged at each of the other two sides that are opposite to each other via the die pad 20. The above number of connection terminals 30 is only an example, and the embodiment is not limited thereto. In addition, a rear surface 31d of the individual connection terminal 30 is exposed to the outside in the sealing main surface 63 of the sealing material 60 and is on the same plane as the sealing main surface 63 and the rear surface 21 of the die pad 20. In addition, a part of the individual connection terminal 30, the part including at least the corresponding anchor parts 32, is sealed by the sealing material 60, and one end surface 31e is protruded from a sealing side surface 61 of the sealing material 60. The protrusion length from the sealing side surface 61 to the one end surface 31e is 0.25 μm or more and 0.30 μm or less. The lead part 31 includes an inner lead part 31g, which is a portion sealed by the sealing material 60, and an outer lead part 31h, which is a portion extending beyond the sealing side surface 61 of the sealing material 60. The individual connection terminal 30 is made of metal such as copper or a copper alloy having excellent conductivity. In addition, for example, material made of tin, silver, a tin alloy, or a silver alloy is formed as a plating film on a surface of the individual connection terminal 30 by plating or the like, to improve the corrosion resistance. Regarding the individual connection terminal 30, the copper or the copper alloy of a first front surface and first side parts of the inner lead part 31g and the one end surface 31e of the outer lead part 31h are exposed (no plating film is formed). In contrast, plating films are formed on the rear surface 31d of the lead part 31 and a first front surface and first side parts of the outer lead part 31h. In the sealing material 60 having an approximately rectangular shape, the end surfaces of the suspension pin parts 22 of the die pad 20 are exposed to the outside in the two sealing side surfaces 62 opposite to each other, and the outer lead parts 31h of the connection terminals 30 extend beyond the other two sealing side surfaces 61 opposite to each other.

The semiconductor element 40 includes a switching element such as an IGBT or a power MOSFET made of silicon or silicon carbide, for example. This semiconductor element 40 includes, for example, an input electrode (a drain electrode or a collector electrode) as a main electrode on a rear surface thereof and a control electrode (a gate electrode) and an output electrode (a source electrode or an emitter electrode) as a main electrode on a front surface thereof. The rear surface of the above semiconductor element 40 is bonded to the die pad 20 via solder (not illustrated). Alternatively, the semiconductor element 40 may include a diode such as an SBD or an FWD. This semiconductor element 40 includes an output electrode (a cathode electrode) as a main electrode on a rear surface and an input electrode (an anode electrode) as a main electrode on a front surface. Alternatively, the semiconductor element 40 may be a reverse-conducting (RC)-IGBT element that includes a circuit in which an IGBT and an FWD are connected in reverse parallel to each other.

The individual bonding wire 50 is made of, for example, metal material such as aluminum or copper having excellent conductivity or an alloy containing at least one kind of these elements. The individual bonding wire 50 of the semiconductor device 10 is made of copper or a copper alloy. In addition, the diameter of the individual bonding wire 50 is preferably 100 μm or more and 1 mm or less. Alternatively, a connection member such as a plate-shaped lead frame or a thin ribbon may be used in place of the individual bonding wire 50. The sealing material 60 is made of, for example, thermoset resin such as maleimide-modified epoxy resin, maleimide-modified phenolic resin, or maleimide resin.

Figure 4A:
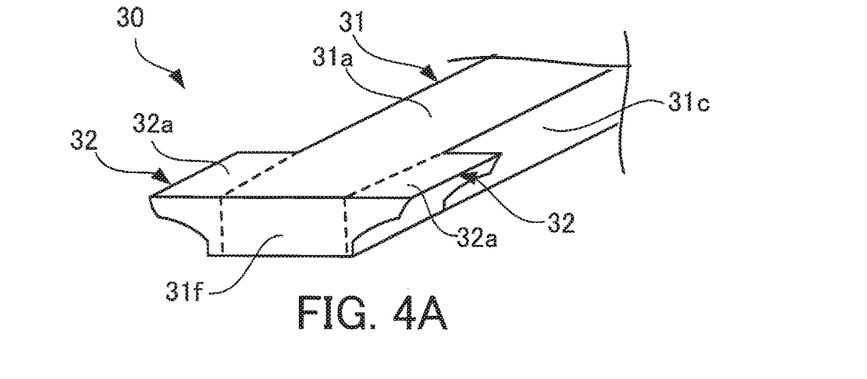
FIGS. 4A to 4C illustrate a connection terminal included in the semiconductor device according to the embodiment.
Figure 4B:
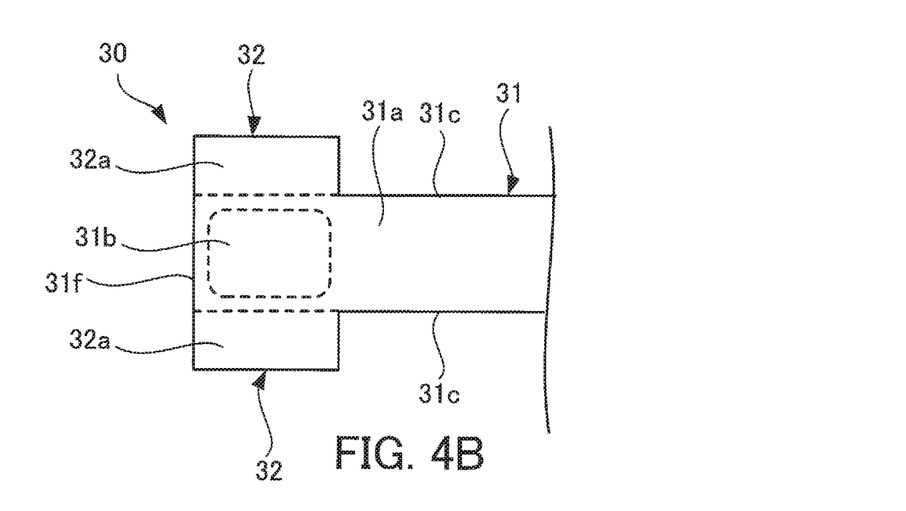
Figure 4C:
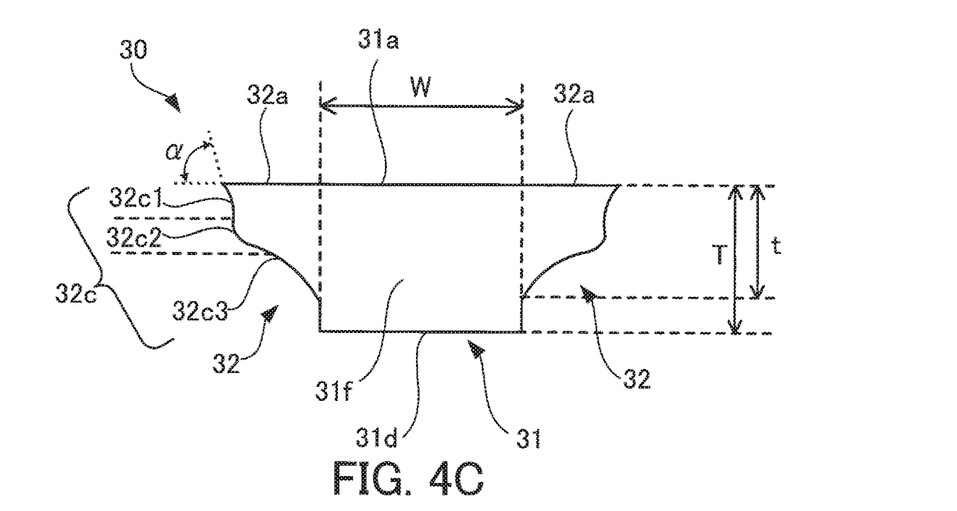

Next, the individual connection terminal 30 included in the semiconductor device 10 according to the embodiment will be described in detail with reference to FIGS. 4A to 4C. FIG. 4A is a perspective view of the anchor part 32 of a connection terminal 30. FIG. 4B is a plan view of the anchor part 32 of the connection terminal 30. FIG. 4C is a front view of an opposite end surface 31f of the connection terminal 30 on the side of the anchor part 32. The plating films formed on the connection terminal 30 are not illustrated in FIGS. 4A to 4C.

The individual connection terminal 30 includes the plate-shaped lead part 31 and the anchor parts 32. The lead part 31 includes a bonding area 31b to which a bonding wire 50 is bonded. The anchor parts 32 protrude from first side parts 31c of the lead part 31. The lead part 31 has the inner lead part 31g and the outer lead part 31h as described above. The inner lead part 31g has a first front surface 31a including the bonding area 31b and the first side parts 31c and is sealed by the sealing material 60. A film made of gold, silver, a gold alloy, or a silver alloy may be formed on the bonding area 31b. The outer lead part 31h extends beyond one of the sealing side surfaces 61 of the sealing material 60. For example, a thickness T of the lead part 31 is 100 μm or more and 400 μm or less. A width W of the lead part 31 is equal to or larger than the thickness T of the lead part 31. For example, the width W is 200 μm or more and 500 μm or less. A length of the lead part 31 is longer than the width W of the lead part 31. For example, the length is 400 μm or more and 1,000 μm or less, depending on the setting of the semiconductor device 10.

The individual anchor part 32 protrudes by a predetermined protrusion length from at least one of the first side parts 31c that are opposite to each other via the bonding area 31b in a planar view. In addition, the individual anchor part 32 has a second front surface 32a on the same plane as the first front surface 31a in a sectional view perpendicular to a long-side direction of the lead part 31, and the protrusion length of the anchor part 32 is shortest at the rear surface 31d of the lead part 31. A specific configuration of the anchor part 32 will be described below. The individual anchor part 32 includes the second front surface 32a and a second side part 32c that have a sectional shape illustrated in FIG. 4C. The second front surface 32a of the anchor part 32 is formed on approximately the same plane as the front surface 31a of the lead part 31. Seen from the inside of the lead part 31, the second side part 32c of the individual anchor part 32 includes a first curved surface 32c1 having a concave curved surface, a second curved surface 32c2 having a convex curved surface, and a third curved surface 32c3 having a concave curved surface in this order from the second front surface 32a. The first curved surface 32c1 is formed to have a taper angle α with the second front surface 32a of the anchor part 32 at the corner of the second front surface 32a and the first curved surface 32c1. The taper angle α is 30 degrees or more and 75 degrees or less. The first curved surface 32c1 starts from the second front surface 32a at the above angle, is curved in a concave shape toward the lead part 31, and extends toward the rear surface 31d of the lead part 31. The second curved surface 32c2 starts from the end of the above first curved surface 32c1, is bent in a convex shape toward the outside of the lead part 31, and extends toward the rear surface 31d of the lead part 31. The curvature of the second curved surface 32c2 is larger than those of the first curved surface 32c1 and the third curved surface 32c3. The third curved surface 32c3 starts from the end of the above second curved surface 32c2, is bent in a concave shape toward the lead part 31, and is connected to the first side part 31c of the lead part 31. The surface distance of the third curved surface 32c3 is longer than those of the first curved surface 32c1 and the second curved surface 32c2. In addition, the curvature of the third curved surface 32c3 is smaller than those of the first curved surface 32c1 and the second curved surface 32c2. A thickness t at the thickest portion of the anchor part 32 is equal to or less than the thickness T of the lead part 31. For example, the thickness t is 100 μm or more and 300 μm or less. The above anchor part 32 is formed by sandwiching and pressing a plate-shaped metal material including the lead part 31 with a predetermined die. While an anchor part 32 is formed on each of the first side parts 31c of the lead part 31 of the individual connection terminal 30 in the present embodiment, an anchor part 32 may be formed on only one of the first side parts 31c of the lead part 31.

Figure 5A:
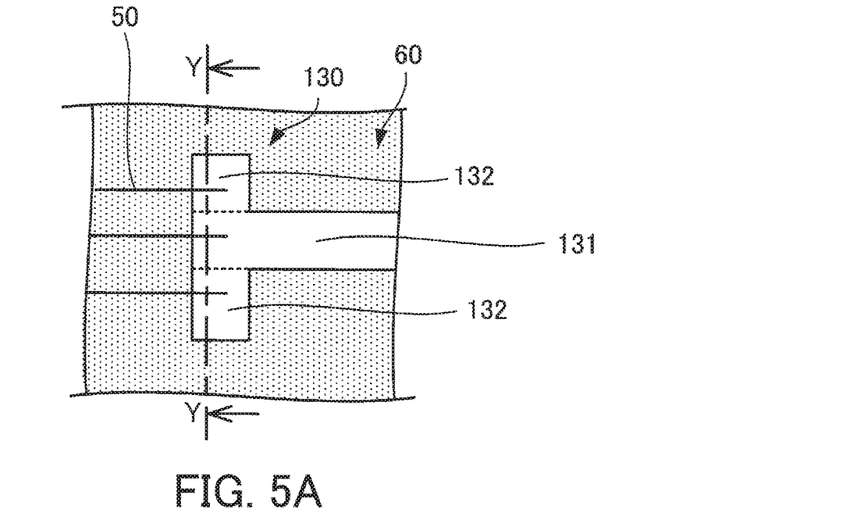
FIGS. 5A and 5B illustrate a reference example.
Figure 5B:
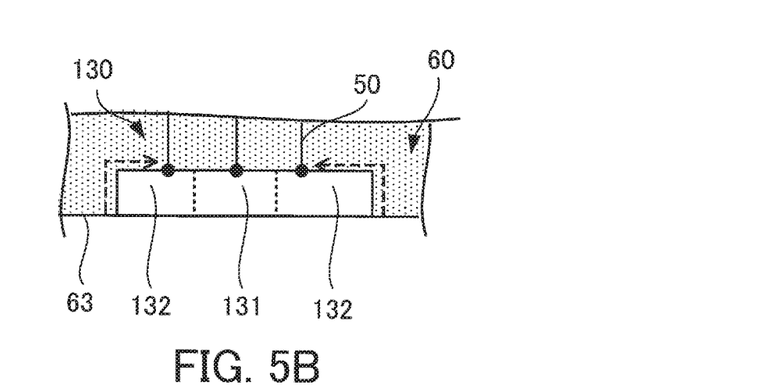
Figure 5C:
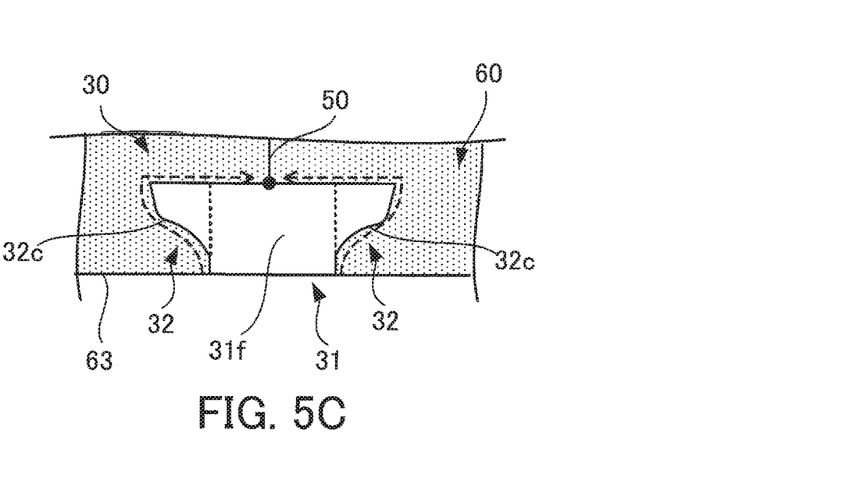
FIG. 5C illustrates the connection terminal included in the semiconductor device according to the embodiment.

Next, a case where the individual connection terminal 30 having the above anchor parts 32 is sealed by the sealing material 60 will be described with reference to FIGS. 5A to 5C. FIGS. 5A and 5B illustrate a reference example, and FIG. 5C illustrates the connection terminal included in the semiconductor device according to the embodiment. More specifically, FIGS. 5A and 5B are a plan view and a sectional view of a connection terminal according to a reference example. FIG. 5B is a sectional view of a connection terminal 130, taken along an alternate long and short dash line Y-Y in FIG. 5A. FIG. 5C is a sectional view of an opposite end surface 31f (the anchor parts 32) of a connection terminal 30. Detailed reference characters of the constituent elements of the connection terminal 30 illustrated in FIG. 5C are omitted. The plating films formed on the connection terminal 30 are not illustrated in FIG. 5C.

First, a case where the connection terminal 130 according to the reference example is arranged in place of the individual connection terminal 30 in the semiconductor device 10 will be described. The connection terminal 130 includes a lead part 131 and anchor parts 132 formed on both sides of the lead part 131. The connection terminal 130 is a T-shaped terminal when seen in a planar view. The lead part 131 and the anchor parts 132 are formed to have the same thickness. Bonding wires 50 are bonded to the connection terminal 130, and the connection terminal 130 is sealed by sealing material 60. The connection terminal 130 is sealed in such a manner that the entire rear surface of the connection terminal 130 is exposed to the outside in a sealing main surface 63 of the sealing material 60. The exposed rear surface of the connection terminal 130 is on the same plane as the sealing main surface 63. With this configuration, moisture from the outside could enter into the gap between the sealing main surface 63 of the sealing material 60 and the connection terminal 130. The moisture that has entered into the gap reaches the bonding wires 50 (the bonding portions between the individual bonding wires 50 and the connection terminal 130) through the paths as indicated by dashed arrows in FIG. 5B. If moisture adheres to copper, the copper will corrode. Therefore, when the bonding wires 50 are made of copper or a copper alloy, the bonding wires 50 could be disconnected from the connection terminal 130.

When the connection terminal 30 is used, as is the case in FIG. 5B, the moisture from the outside that has entered into the gap between the sealing main surface 63 of the sealing material 60 and the connection terminal 30 also reaches the bonding wire 50 (the bonding portion between the bonding wire 50 and the connection terminal 30) through the paths as indicated by dashed arrows in FIG. 5C. However, in the case of the connection terminal 30, the second side parts 32c of the anchor parts 32 formed on the first side parts 31c of the lead part 31 have curved surfaces. Thus, the distance (the surface distance: the individual dashed arrow in FIG. 5C) from the gap between the sealing main surface 63 and the connection terminal 30 (the lead part 31) to the bonding wire 50 on the lead part 31 is longer than that in the case in FIG. 5B. In addition, since the bonding wire 50 is bonded to the lead part 31 of the connection terminal 30, the surface distance is further extended. As a result, a less amount of moisture enters into the gap between the connection terminal 30 and the sealing main surface 63, compared with the case in which the connection terminal 130 is used. Thus, the bonding between the connection terminal 30 and the bonding wire 50 is maintained.

As described above, the second side part 32c of the individual anchor part 32 formed on the individual first side part 31c of the lead part 31 of the individual connection terminal 30 has a curved surface formed by the first curved surface 32c1, the second curved surface 32c2, and the third curved surface 32c3. Therefore, when a connection terminal 30 is sealed, the sealing material 60 easily flows along the second side parts 32c of the corresponding anchor parts 32 and tightly seals the boundary between the connection terminal 30 and the sealing material 60. As a result, occurrence of a void in the boundary between the sealing material 60 and the connection terminal 30 is reduced. Thus, peeling of the sealing material 60 from the connection terminal 30 occurs less. In addition, since each of the first curved surface 32c1, the second curved surface 32c2, and the third curved surface 32c3 is a smooth curve, occurrence of a crack in a corner in the sealing material 60 is prevented. In addition, since entering of moisture into the bonding area 31b of the individual bonding wire 50 is reduced, good bonding of the bonding wire 50 is maintained.

The semiconductor device 10 having the above configuration includes the semiconductor element 40, the bonding wires 50 electrically connected to the semiconductor element 40, the connection terminals 30, and the sealing material 60 that seals the semiconductor element 40, the bonding wires 50, and a part of the connection terminals 30. The individual connection terminal 30 includes the plate-shaped lead part 31 having the first front surface 31a including the bonding area 31b to which a bonding wire 50 is connected, the rear surface 31d opposite to the front surface 31a, and the first side parts 31c located between the first front surface 31a and the rear surface 31d. The individual connection terminal 30 also includes the anchor parts 32 that protrude from the individual first side parts 31c. In addition, the lead part 31 includes the inner lead part 31g having at least a part of the first front surface 31a and the first side parts 31c, the part being sealed by the sealing material 60, and the outer lead part 31h extending beyond one of the sealing side surfaces 61 of the sealing material 60. The individual anchor part 32 protrudes by a predetermined protrusion length from at least one of the first side parts 31c opposite to each other via the bonding area 31b in a planar view and has a second front surface 32a on the same plane as the first front surface 31a in a sectional view perpendicular to a long-side direction of the lead part 31. The protrusion length of the individual anchor part 32 is shortest at the rear surface 31d. Since the rear surface 21 and the individual rear surface 31d exposed to the outside in the sealing main surface 63 of the sealing material 60 occupy a predetermined area or more, the heat dissipation of the semiconductor device 10 is improved. In addition, the individual connection terminal 30 of the semiconductor device 10 includes the lead part 31 and the anchor parts 32 formed on the first side parts 31c of the lead part 31. While the rear surface 31d of the individual connection terminal 30 is not sealed by the sealing material 60, since the anchor parts 32 secure an area in which the corresponding connection terminal 30 and the sealing material 60 are in close contact with each other, deterioration of the adhesiveness to the sealing material 60 is prevented. Thus, even if compression or expansion of the sealing material 60 occurs under a thermal cycle environment of the semiconductor device 10, the individual connection terminal 30 is prevented from being detached from the sealing material 60.

Figure 6:
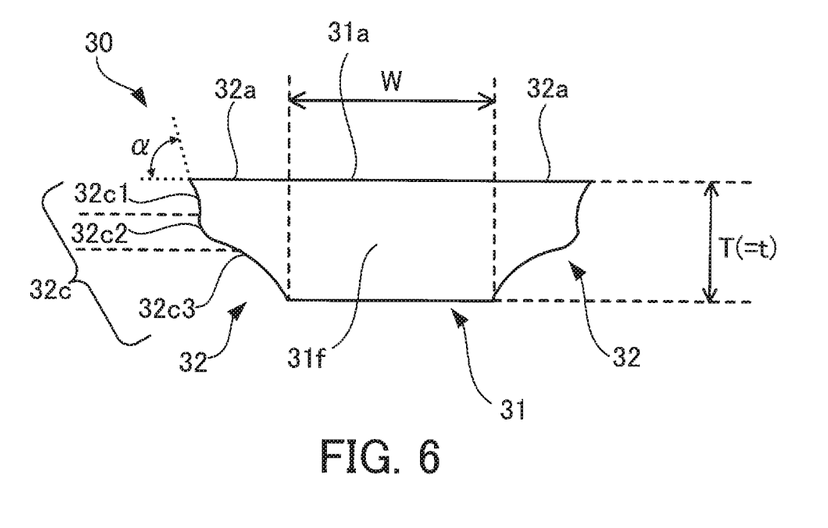
FIG. 6 is a front view of another example of the connection terminal included in the semiconductor device according to the embodiment.

Another example of the individual connection terminal 30 will be described with reference to FIG. 6. FIG. 6 is a front view of another example of the connection terminal included in the semiconductor device according to the embodiment. The front view of the opposite end surface 31f of this connection terminal 30 illustrated in FIG. 6 differs from the front view of the opposite end surface 31f in FIG. 4C. In the case of this connection terminal 30 illustrated in FIG. 6, the thickness T of the lead part 31 and the thickness t at the thickest portion of the individual anchor part 32 are approximately the same. The rest of the configuration is the same as that of the connection terminal 30 in FIGS. 4A to 4C. The connection terminal 30 in this example also provides the same advantageous effects as those of the connection terminal 30 illustrated in FIGS. 4A to 4C.

Figure 7:
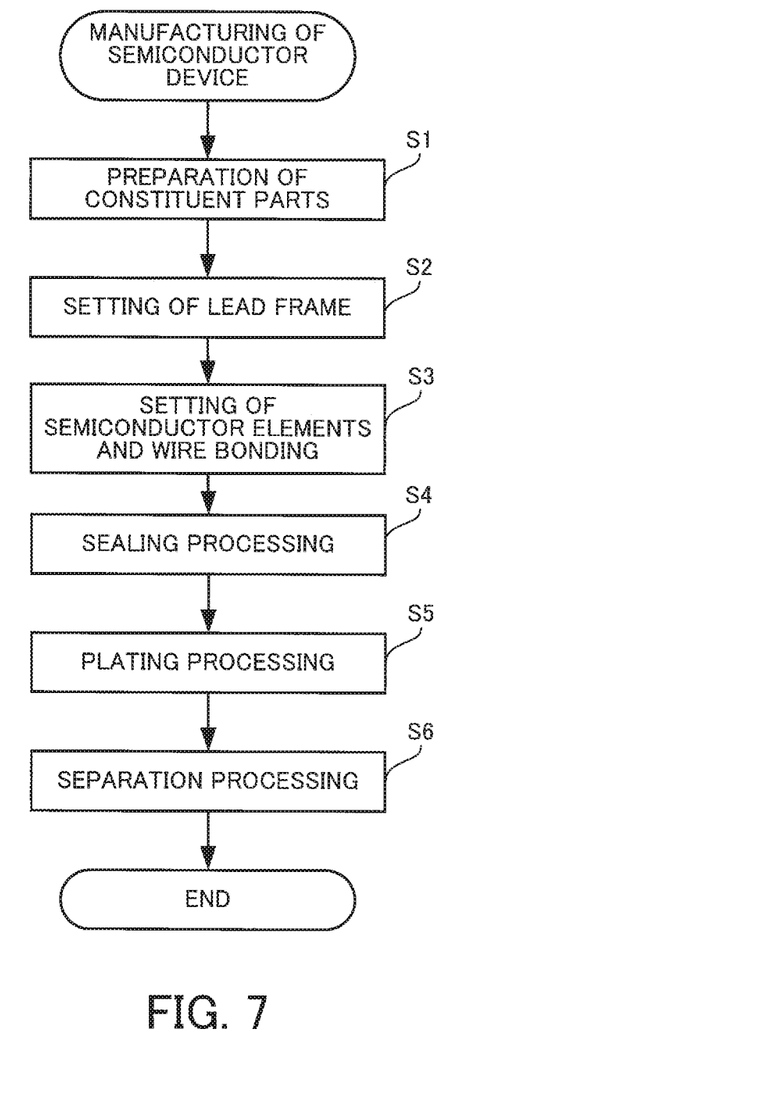
FIG. 7 is a flowchart illustrating a semiconductor device manufacturing method according to the embodiment.
Figure 8:
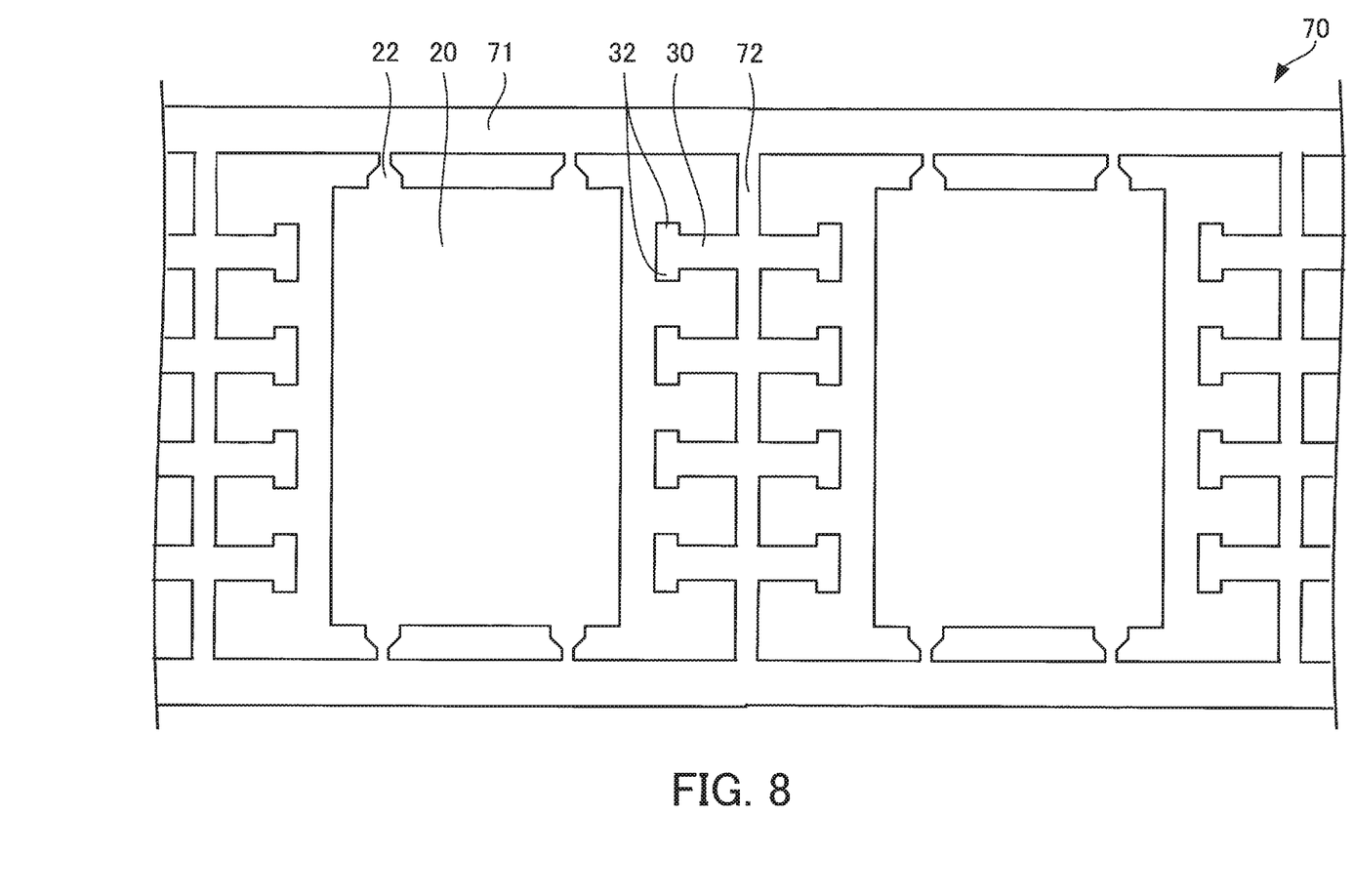
FIG. 8 illustrates a metal frame setting step included in the semiconductor device manufacturing method according to the embodiment.
Figure 9:
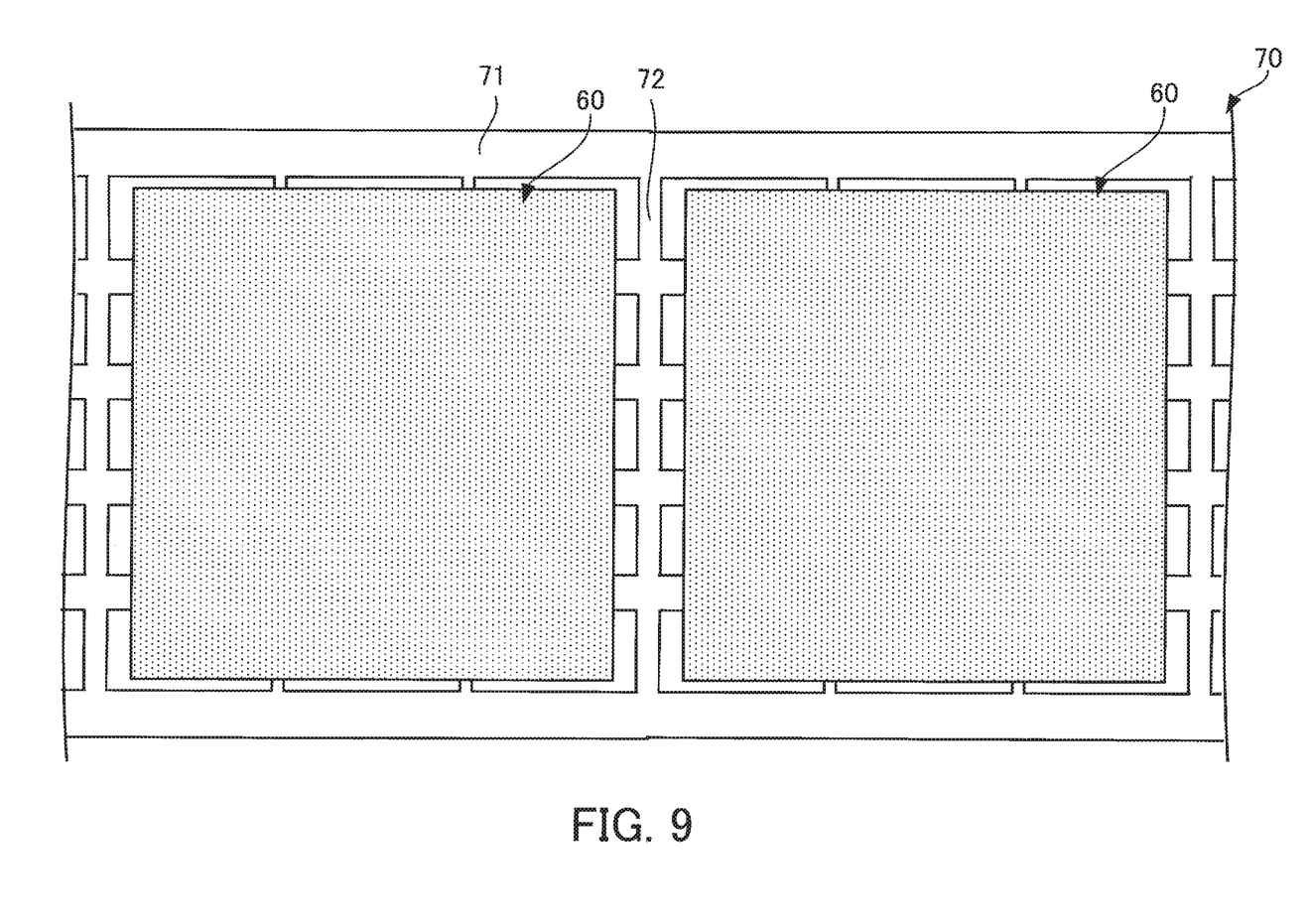
FIG. 9 illustrates a sealing step included in the semiconductor device manufacturing method according to the embodiment.
Figure 10:
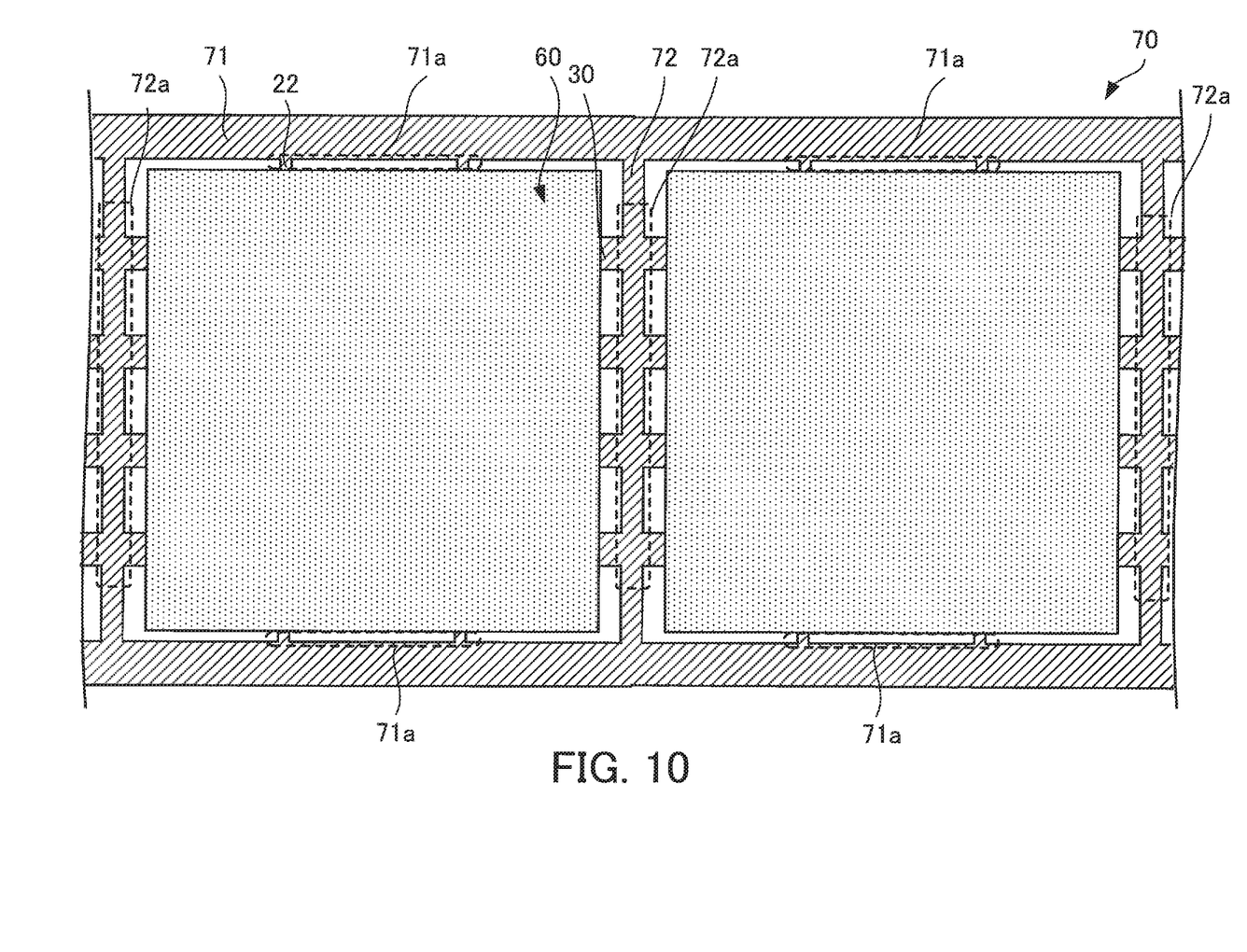
FIG. 10 illustrates a plating step included in the semiconductor device manufacturing method according to the embodiment.

Next, a manufacturing method of the semiconductor device 10 will be described with reference to FIGS. 7 to 10 and FIGS. 1A to 3. FIG. 7 is a flowchart illustrating a semiconductor device manufacturing method according to the embodiment. FIG. 8 illustrates a metal frame setting step included in the semiconductor device manufacturing method according to the embodiment. FIG. 9 illustrates a sealing step included in the semiconductor device manufacturing method according to the embodiment. FIG. 10 illustrates a plating step included in the semiconductor device manufacturing method according to the embodiment. FIGS. 8 to 10 illustrate main parts.

[Step S1] A lead frame 70 (described below) including the die pads 20 and the connection terminals 30, the semiconductor elements 40, the sealing material 60, etc. are prepared in advance. More specifically, the semiconductor elements 40 and the sealing material 60 described above are prepared. The lead frame 70 is made of copper or a copper alloy, for example.

[Step S2] The lead frame 70 is set at a predetermined position. For example, the lead frame 70 illustrated in FIG. 8 includes a pair of frame parts 71 to which a die pad 20 is connected via suspension pin parts 22 and a tie bar 72 that connects the pair of frame parts 71 and to which a plurality of connection terminals 30 are connected. Namely, the lead frame 70 integrates the die pads 20 and the plurality of connection terminals 30. The lead frame 70 is formed by punching out a metal plate with a predetermined die. When the metal plate is punched out, the individual connection terminals 30 of the lead frame 70 are provided with what will be the anchor parts 32. As described above, the anchor parts 32 are obtained by sandwiching the plate-shaped connection terminals 30 with a predetermined die.

[Step S3] The semiconductor elements 40 are set on the respective die pads 20 of the lead frame 70 by soldering or the like, and the semiconductor elements 40 and the tie bars 72 are electrically connected by the bonding wires 50. This step is not illustrated.

[Step S4] The semiconductor elements 40 arranged on the die pads 20 of the lead frame 70, an area including the anchor parts 32 of the connection terminals 30, and the bonding wires 50 are sealed by the sealing material 60 with a predetermined mold, as illustrated in FIG. 9. While not illustrated, on the opposite side of the side illustrated in FIG. 9, the rear surfaces of the die pads 20 and the connection terminals 30 are exposed to the outside.

[Step S5] Plating is performed by using tin, silver, a tin alloy, or a silver alloy on the exposed portions of the die pads 20 and the connection terminals 30 of the lead frame 70. In this step, plating is performed on the rear surfaces of the die pads 20 and the connection terminals 30. Namely, plating is performed on the opposite side of the side illustrated in FIG. 9. The die pads 20 and the connection terminals 30 are made of copper or a copper alloy. Solder is easily applied to portions of the die pads 20 and the connection terminals 30, the portions where the plating films of tin, silver, a tin alloy, or a silver alloy are formed. Thus, when external wiring members are bonded to the semiconductor device via solder, good bonding is achieved.

[Step S6] The die pads 20 and the connection terminals 30 that have been sealed by the sealing material 60 are separated from the frame parts 71 and tie bars 72 of the lead frame 70. In this step, first, as illustrated in FIG. 10, punch-out areas 72a of the tie bars 72 are punched out by a die. The connection terminals 30 extend beyond the sealing side surfaces 61 of the individual sealing material 60, the sealing side surfaces 61 being opposite to each other. By simultaneously punching out both of the punch-out areas 72a at the sealing side surfaces 61 opposite to each other, the punching is performed without excessively distorting the connection terminals 30 remaining in the sealing material 60. The one end surface 31e (see FIGS. 1A and 1B) of the individual connection terminal 30 formed by the punching as described above has a dull face (not illustrated), and no plating film is formed thereon. The outer lead parts 31h of the connection terminals 30 have different colors, depending on the presence of a plating film. Namely, it is possible to determine whether the plating has been performed on a connection terminal 30 by observing the one end surface 31e (see FIGS. 1A and 1B) and the rear surface of the connection terminal 30.

The tie bars 72 may be separated by using a different method other than the punching. For example, dicing using a dicing blade may be used. However, solder is not properly applied to the connection terminals 30 that have been separated by dicing. Therefore, the wiring members are not securely bonded to the connection terminals 30 via solder. For this reason, punching is suitable for separating the tie bars 72.

Likewise, the die pads 20 are also separated from the frame parts 71 by punching out punch-out areas 71a of the suspension pin parts 22 with a die. The suspension pin parts 22 extend beyond the sealing side surfaces 62 of the sealing material 60, the sealing side surfaces 62 being opposite to each other. By simultaneously punching out both of the punch-out areas 71a at the sealing side surfaces 62 opposite to each other, the punching is performed without excessively distorting the suspension pin parts 22 remaining in the sealing material 60. The exposed surface of the individual suspension pin part 22 formed by the punching as described above has a dull face (not illustrated), and no plating film is formed thereon. Namely, it is possible to determine whether the plating has been performed on a die pad 20 by observing the end surfaces of the corresponding suspension pin parts 22 and the rear surface of the die pad 20. In addition, the suspension pin parts 22 and the connection terminals 30 are exposed to the outside in the sealing side surfaces 61 and 62, which are perpendicular to each other, of the sealing material 60 of the semiconductor device 10. The punch-out areas 72a of the tie bars 72 and the punch-out areas 71a of the suspension pin parts 22 may be punched out simultaneously. By performing the above steps, the semiconductor device 10 illustrated in FIGS. 1A to 4C is obtained.

According to the disclosed technique, the heat dissipation is improved, and degradation of the reliability of the semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor element;
   a connection member that is electrically connected to the semiconductor element;
   a connection terminal that includes
      a plate-shaped lead part having a first front surface including a bonding area to which the connection member is bonded, a rear surface opposite to the first front surface, and first side surfaces opposite to each other and located between the first front surface and the rear surface, and
      an anchor part protruding from one of the first side surfaces at a position corresponding to the bonding area, the anchor part having a second front surface on a plane of the first front surface, and a second side surface between the second front surface and the rear surface at a side where one of the first side surfaces of the lead part is located; and
   a sealing material that seals the semiconductor element, the connection member, and a part of the connection terminal and that has a sealing main surface on a plane of the rear surface of the connection terminal, and a first sealing side surface perpendicular to the sealing main surface and the first side surfaces of the lead part,
   wherein the lead part includes an inner lead part sealed by the sealing material, and an outer lead part exposed outside the sealing material from the first sealing side surface, and
   wherein the anchor part protrudes by a predetermined protrusion length from the one of the first side surfaces, and in a sectional view perpendicular to a long-side direction of the lead part, at the one of the first side surfaces, the closer is a position of the anchor part to the rear surface of the connection terminal is, the shorter is the protrusion length of the anchor part.

2. The semiconductor device according to claim 1, wherein the anchor part includes a first anchor part and a second anchor part that are respectively disposed on the first side surfaces, the bonding area of the lead part being positioned between the first and second anchor parts in a plan view of the semiconductor device.

3. The semiconductor device according to claim 1, wherein an angle formed by the second front surface and the second side surface of the anchor part is in a range of 30 degrees to 75 degrees in the sectional view.

4. The semiconductor device according to claim 3, wherein, the second side surface includes a first curved surface including a concave curved surface, a second curved surface including a convex curved surface, and a third curved surface including a concave curved surface in this order from the second front surface toward the rear surface in the sectional view.

5. The semiconductor device according to claim 1, wherein a rear surface of the inner lead part is exposed from the sealing main surface and is on a plane same as a plane of the sealing main surface.

6. The semiconductor device according to claim 1, wherein the semiconductor element includes a control electrode and an output electrode on a front surface thereof and an input electrode on a rear surface thereof, wherein the semiconductor device further includes a die pad having a front surface that includes an element area on which the semiconductor element is disposed, the rear surface of the semiconductor element facing the front surface of the die pad, and wherein the sealing material seals the front surface and side surfaces of the die pad in such a manner that the rear surface of the die pad is exposed from the sealing main surface.

7. The semiconductor device according to claim 6, wherein the connection terminal is one connection terminal, the semiconductor device further comprising another connection terminal, wherein
   the sealing material seals the one and other connection terminals, and further includes a second sealing side surface opposite to the first sealing side surface, the die pad being disposed between the first and second sealing side surfaces, and
   wherein one end of each of the one and other connection terminals protrudes from the first sealing side surface or the second sealing side surface so that an end surface of the one end of the outer lead part is located outside the sealing material.

8. The semiconductor device according to claim 7, wherein the sealing material has a third sealing side surface and a fourth sealing side surface that are opposite to each other and are perpendicular to the first and second sealing side surfaces, and the die pad includes a suspension pin part exposed from the third sealing side surface or the fourth sealing side surface.

9. The semiconductor device according to claim 7, wherein
the one and other connection terminals are made of copper or a copper alloy, and
the first front surface and the first side parts of the inner lead part, and the end surface of the outer lead part are each free of an additional film on the copper or copper alloy thereof, and
the rear surface of the lead part and the first front surface, and the first side surfaces of the outer lead part each have a plating film formed on the copper or copper alloy thereof.

10. The semiconductor device according to claim 9, wherein the plating film is made of tin, silver, a tin alloy, or a silver alloy.

11. The semiconductor device according to claim 6, wherein the sealing main surface of the sealing material is on a plane of the rear surface of the die pad.

12. The semiconductor device according to claim 1, wherein the connection member is made of copper or a copper alloy.

13. The semiconductor device according to claim 1,
wherein the connection terminal is made of copper or a copper alloy, and
wherein the bonding area has a film made of gold, silver, a gold alloy, or a silver alloy formed thereon.

14. The semiconductor device according to claim 1, wherein the plate-shaped lead part is unbent so that the plate-shape lead part has an entirely flat shape.

* * * * *